US008433073B2

(12) United States Patent
Yoshioka et al.

(10) Patent No.: US 8,433,073 B2
(45) Date of Patent: Apr. 30, 2013

(54) ADDING A SOUND EFFECT TO VOICE OR SOUND BY ADDING SUBHARMONICS

(75) Inventors: Yasuo Yoshioka, Hamamatsu (JP); Alex Loscos, Barcelona (ES)

(73) Assignee: Yamaha Corporation, Hamamatsu-shi (JP)

( * ) Notice: Subject to any disclaimer, the term of this patent is extended or adjusted under 35 U.S.C. 154(b) by 1404 days.

(21) Appl. No.: 11/159,032

(22) Filed: Jun. 22, 2005

(65) Prior Publication Data

US 2005/0288921 A1 Dec. 29, 2005

(30) Foreign Application Priority Data

Jun. 24, 2004 (JP) ................................. 2004-186012

(51) Int. Cl.

| | |
|---|---|
| ***G10L 11/00*** | (2006.01) |
| ***G10L 11/04*** | (2006.01) |
| ***G10L 19/14*** | (2006.01) |
| ***G10L 21/00*** | (2006.01) |
| ***H03G 3/00*** | (2006.01) |
| ***A63H 5/00*** | (2006.01) |

(52) U.S. Cl.

USPC ............. 381/61; 704/200; 704/205; 704/206; 704/207; 704/270; 704/278

(58) Field of Classification Search .................. 704/270, 704/278, 200; 381/61, 62; 84/609, 610, 84/611, 612, 613, 614, 615, 616, 626

See application file for complete search history.

(56) References Cited

U.S. PATENT DOCUMENTS

| | | | | | |
|---|---|---|---|---|---|
| 3,787,602 | A | * | 1/1974 | Okudaira | 84/700 |
| 3,913,442 | A | * | 10/1975 | Deutsch | 84/623 |
| 4,957,030 | A | * | 9/1990 | Suzuki | 84/604 |
| 4,991,218 | A | * | 2/1991 | Kramer | 381/61 |
| 5,442,130 | A | * | 8/1995 | Kitayama et al. | 84/661 |
| 5,526,431 | A | * | 6/1996 | Shioda | 381/61 |
| 5,536,902 | A | * | 7/1996 | Serra et al. | 84/623 |

(Continued)

FOREIGN PATENT DOCUMENTS

| | | |
|---|---|---|
| JP | 03-101798 | 4/1991 |
| JP | 8328587 | 12/1996 |
| JP | 11-175070 | 7/1999 |
| JP | 2003-288095 | 10/2003 |

OTHER PUBLICATIONS

Gauffin, J., Granqvist, S., Hammarberg, B., Heriegård, S., Håkansson, A. "Irregularities in the voice: some perceptual experiments using synthetic voices." 1995. Proceedings of the International Congress of Phonetic Sciences, session 24.1. vol. 2. pp. 242-245.*

(Continued)

*Primary Examiner* — Paras D Shah

(74) *Attorney, Agent, or Firm* — Pillsbury Winthrop Shaw Pittman LLP

(57) ABSTRACT

In a sound effect applying apparatus, an input part frequency-analyzes an input signal of sound or voice for detecting a plurality of local peaks of harmonics contained in the input signal. A subharmonics provision part adds a spectrum component of subharmonics between the detected local peaks so as to provide the input signal with a sound effect. An output part converts the input signal of a frequency domain containing the added spectrum component into an output signal of a time domain for generating the sound or voice provided with the sound effect.

13 Claims, 5 Drawing Sheets

U.S. PATENT DOCUMENTS

| | | | | | |
|---|---|---|---|---|---|
| 5,763,807 | A * | 6/1998 | Clynes | 84/705 |
| 5,781,636 | A * | 7/1998 | Tai | 381/62 |
| 5,862,232 | A * | 1/1999 | Shinbara et al. | 381/61 |
| 5,930,373 | A * | 7/1999 | Shashoua et al. | 381/98 |
| 5,963,907 | A | 10/1999 | Matsumoto | |
| 6,134,330 | A * | 10/2000 | De Poortere et al. | 381/61 |
| 6,316,710 | B1 * | 11/2001 | Lindemann | 84/609 |
| 6,336,092 | B1 * | 1/2002 | Gibson et al. | 704/268 |
| 6,504,935 | B1 * | 1/2003 | Jackson | 381/61 |
| 6,591,240 | B1 * | 7/2003 | Abe | 704/278 |
| 6,704,711 | B2 * | 3/2004 | Gustafsson et al. | 704/258 |
| 7,003,120 | B1 * | 2/2006 | Smith et al. | 381/61 |
| 7,027,980 | B2 * | 4/2006 | Ramabadran et al. | 704/217 |
| 7,135,636 | B2 * | 11/2006 | Kemmochi et al. | 84/622 |
| 7,136,493 | B2 * | 11/2006 | Coats et al. | 381/61 |
| 7,248,702 | B2 * | 7/2007 | Packard | 381/61 |
| 7,257,230 | B2 * | 8/2007 | Nagatani | 381/56 |
| 7,342,168 | B2 * | 3/2008 | Setoguchi | 84/619 |
| 7,389,231 | B2 * | 6/2008 | Yoshioka et al. | 704/268 |
| 2002/0061109 | A1 * | 5/2002 | Aarts | 381/61 |
| 2003/0044023 | A1 * | 3/2003 | Larsen | 381/61 |
| 2003/0055647 | A1 * | 3/2003 | Yoshioka et al. | 704/258 |
| 2003/0221542 | A1 | 12/2003 | Kenmochi | |
| 2004/0011191 | A1 * | 1/2004 | Larsen | 84/699 |
| 2005/0004691 | A1 * | 1/2005 | Edwards | 700/94 |

OTHER PUBLICATIONS

Cheng-Gia Tsai, "Auditory Grouping in the Perception of Roughness Induced by Subharmonics: Empirical Findings and a qualitative Model," ISMA, XP-002400181, Dept. of Musicology, Humboldt University Berlin, Germany (Nara), (Apr. 3, 2004).

X. Amatriain, et al., "Spectral Modeling for Higher-level Sound Transformations," Proceedings of Mosart Workshop on Current Research Directions in Computer Music, XP-002400179 (Naples, Italy), (2001).

A. Loscos, J. Bonada, "Emulating Rough and Growl Voice in Spectral Domain," Proc. of the 7th Int. Conference on Digital Audio Effects, XP 002400180, Music Technology Group of the Institut Universitari Audiovisual (Barcelona, Spain), (Oct. 8, 2004).

Japanese Patent Office, "Notice of Rejection", Patent Application No. 2004-186012, Drafting Date: Mar. 4, 2010, 6 pages.

* cited by examiner

ADDING A SOUND EFFECT TO VOICE OR SOUND BY ADDING SUBHARMONICS

BACKGROUND OF THE INVENTION

1. Technical Field

The present invention relates to a sound effect applying apparatus and a sound effect applying program for providing input voices with effects.

2. Related Art

As a method for applying distortive feeling to instrumental sounds and human voices, there has been known the distortion technology distorts input sounds by clipping input waveforms.

Further, there is proposed a sound effect applying apparatus in Japanese Non-examined Patent Publication No. 2003-288095. Based on input control parameters, the sound effect applying apparatus controls individual magnitudes of harmonic components and nonharmonic components in a sound to be synthesized so as to control the breathiness magnitude.

While there is known the method of applying the distortion to input sounds as mentioned above, it is desired to apply realistic distortion more meaningful to sounds.

SUMMARY OF THE INVENTION

It is therefore an object of the present invention to provide a sound effect applying apparatus and a sound effect applying program capable of applying a realistic distortion effect to input voices.

To achieve the above-mentioned object, the sound effect applying apparatus according to the present invention comprises: an input part that frequency-analyzes an input signal of sound or voice for detecting a plurality of local peaks of harmonics contained in the input signal; a subharmonics provision part that adds a spectrum component of subharmonics between the detected local peaks so as to provide the input signal with a sound effect; and an output part that converts the input signal of a frequency domain containing the added spectrum component into an output signal of a time domain for generating the sound or voice provided with the sound effect.

In one form, the subharmonics provision part adds between the local peaks a variable spectrum component having a gain which varies irregularly. For example, the subharmonics provision part adds the variable spectrum component in the form of a mixture of a plurality of spectrum components which have the same frequency but which have phase differences irregularly varying with one another.

Preferably, the subharmonics provision part further changes the gain of the variable spectrum component in accordance with a gain of the input signal. For example, the subharmonics provision part increases the gain of the variable spectrum component as the gain of the input signal increases, and holds the gain of the variable spectrum component when the gain of the input signal exceeds a given level.

Preferably, the subharmonics provision part adjusts parameters of the variable spectrum component to be added in accordance with a pitch of the input signal, the parameters specifying at least one of a type, a frequency and a gain of the variable spectrum component.

In another form, the subharmonics provision part adds a plurality of spectrum components having different frequencies between one local peak and another local peak next to said one local peak.

Preferably, the subharmonics provision part changes the gain of the spectrum components in accordance with a gain of the input signal. For example, the subharmonics-provision part increases the gain of the spectrum components as the gain of the input signal increases, and holds the gain of the spectrum components when the gain of the input signal exceeds a given level.

Preferably, the subharmonics provision part adjusts parameters of the spectrum components to be added in accordance with a pitch of the input signal, the parameters specifying at least one of types, frequencies, gains and numbers of the spectrum components.

The sound effect applying program according to the present invention is executable by a computer to perform a method comprising the steps of: frequency-analyzing an input signal of sound or voice for detecting a plurality of local peaks of harmonics contained in the input signal; adding a spectrum component of subharmonics between the detected local peaks so as to provide the input signal with a sound effect; and converting the input signal of a frequency domain containing the added spectrum component into an output signal of a time domain for generating the sound or voice provided with the sound effect.

The sound effect applying apparatus and the sound effect applying program according to the present invention can provide input voices with a more realistic distortion effect by adding subharmonics to the frequency spectrum of the input signal.

Since there is provided a spectrum component having irregularly varying gains between input voice's local peaks, the input voice can be converted into an output voice of the voice quality having creak (squeaking) distortion. Since there is provided a plurality of spectrum components having different frequencies between input voice's local peaks, the input voice can be converted into an output voice of the voice quality having growl (howling) distortion.

The effect intensity can be adjusted by specifying parameters such as types, frequencies, and gains of a spectrum component to be provided, or the number of spectrum components.

The more naturalistic voice quality conversion can be provided by controlling parameters such as types, frequencies, and gains for a spectrum component to be provided, or the number of spectrum components in accordance with an input signal's gain or pitch.

DETAILED DESCRIPTION OF THE INVENTION

Figure 1:
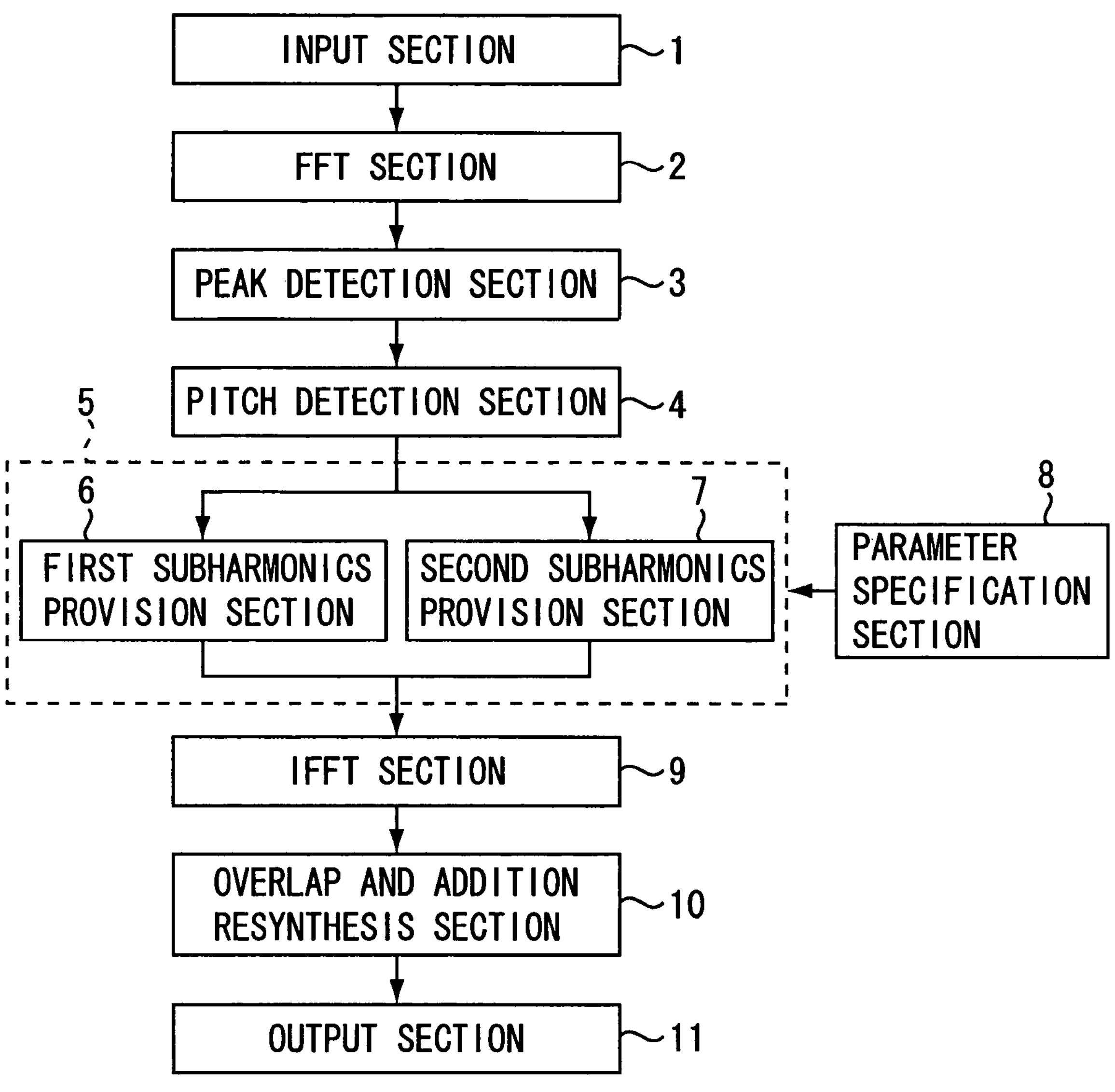
FIG. 1 is a function block diagram showing the configuration of an embodiment of the sound effect applying apparatus according to the present invention.

FIG. 1 is a function block showing the configuration of a sound effect applying apparatus according to an embodiment of the present invention.

In FIG. 1, reference numeral 1 denotes an input section that receives an input voice signal; 2 denotes a Fourier transform section that spectrum-analyzes the input voice on a frame basis to obtain a frequency spectrum; 3 denotes a peak detection section that detects a local peak in the frequency spectrum output from the Fourier transform section; and 4 denotes a pitch detection section that calculates a pitch according to a series of frequencies for the local peaks. The input section 1, Fourier transform section 2, peak detection section 3 and pitch detection section 4 collectively constitute an input part that frequency-analyzes an input signal of sound or voice for detecting a plurality of local peaks of harmonics contained in the input signal.

Reference numeral 5 denotes subharmonics provision means that performs processes in a frequency domain to provide input voices with distortion effects. The sound effect applying apparatus according to the embodiment of the present invention is described to have two types of subharmonics provision sections depending on the types of effects to be provided, i.e., a first subharmonics provision section 6 and a second subharmonics provision section 7. The subharmonics provision means 5 can provide input voices with processes performed in either or both the first subharmonics provision section 6 and the second subharmonics provision section 7.

The first subharmonics provision section 6 provides input voice with a creak (squeaking) distortion effect. The first subharmonics provision section 6 supplies spectrum components having irregularly varying gains between local peak frequencies of the input voice's frequency spectrum. The first subharmonics provision section 6 supplies spectrum components having irregularly varying gains by supplying a plurality of spectrum components having irregularly varying phase differences at the same frequency.

The second subharmonics provision section 7 provides input voice with a growl (howl) distortion effect. The second subharmonics provision section 7 supplies a plurality of spectrum components at different frequencies between local peak frequencies.

A parameter specification section 8 supplies parameters that control spectrum components provided by the first subharmonics provision section 6 and the second subharmonics provision section 7. The parameter specification section 8 supplies the first subharmonics provision section 6 and the second subharmonics provision section 7 with parameters concerning a spectrum component to be added such as its type, its frequency position (deviation from the center frequency between harmonics frequencies), its gain, and the number of spectrum components to be provided. Controlling the parameters makes it possible to adjust the intensity of effects provided by the first and second subharmonics provision sections 6 and 7. The first subharmonics provision section 6, second subharmonics provision section 7 and parameter specification section 8 collectively constitute a subharmonics provision part that adds a spectrum component of subharmonics between the detected local peaks so as to provide the input signal with a sound effect.

Reference numeral 9 denotes an inverse Fourier transform section that transforms a frequency spectrum into a time domain. In this case, the frequency spectrum of the input signal is provided with a spectrum component between local peaks by the first subharmonics provision section 6 or the second subharmonics provision section 7. Reference numeral 10 denotes an overlap and addition resynthesis section that synthesizes respective frame-based signals transformed into time-domain signals by the inverse Fourier transform section 9. Reference numeral 10 denotes an output section that outputs a voice signal supplied from the overlap and addition resynthesis section 10. The parameter specification section 8, inverse Fourier transform section 9, overlap and addition resynthesis section 10 and output section 11 collectively constitute an output part that converts the input signal of a frequency domain containing the added spectrum component into an output signal of a time domain for generating the sound or voice provided with the sound effect.

The above-mentioned constituent elements can be implemented not only as individual processing sections, but also by computer's program processes.

The following describes a subharmonics provision process performed by the first subharmonics provision section 6.

Figure 2:
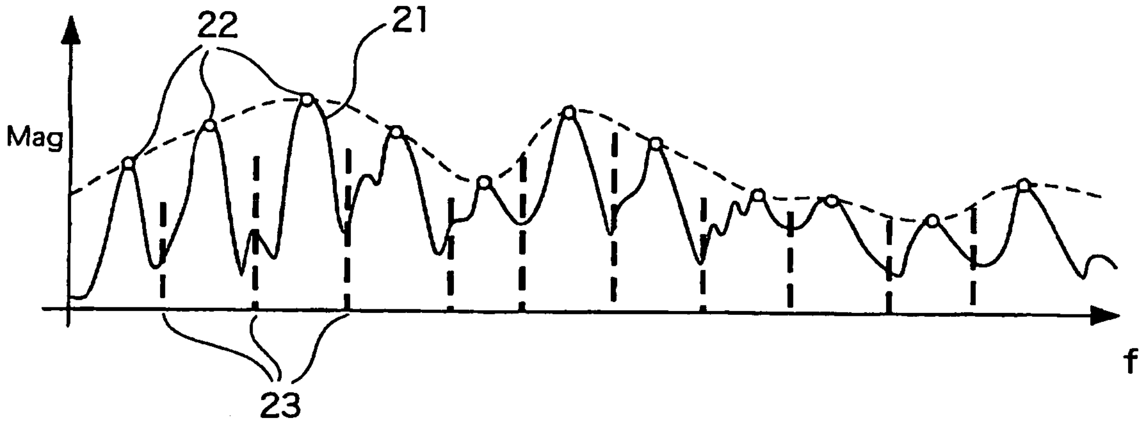
FIG. 2 is a diagram exemplifying a spectrum for analyzing a creak voice.

FIG. 2 shows an example of the spectrum for analyzing a creak (squeaking) voice.

A clear voice provides the spectrum indicated by a solid line 21 in FIG. 2. That is, local peak frequencies (white circles 22 in FIG. 2) approximately correspond to harmonic frequencies. There are no other local peaks having large gains.

However, the creak voice quality causes peaks (indicated by broken lines) other than the peaks corresponding to the harmonic frequencies near frequency positions (between harmonic frequencies) indicated by reference numeral 23 in FIG. 2. It can be understood that their gains irregularly increase and decrease with the progress of time. In other words, it is possible to state that a new harmonic (sub-harmonic) rises at a frequency position between the harmonic frequency positions and that its gain varies irregularly. This phenomenon occurs because a creaky voice causes a variable vocal-fold vibration frequency and this frequency irregularly varies near given frequency $T_0$.

Figure 3:
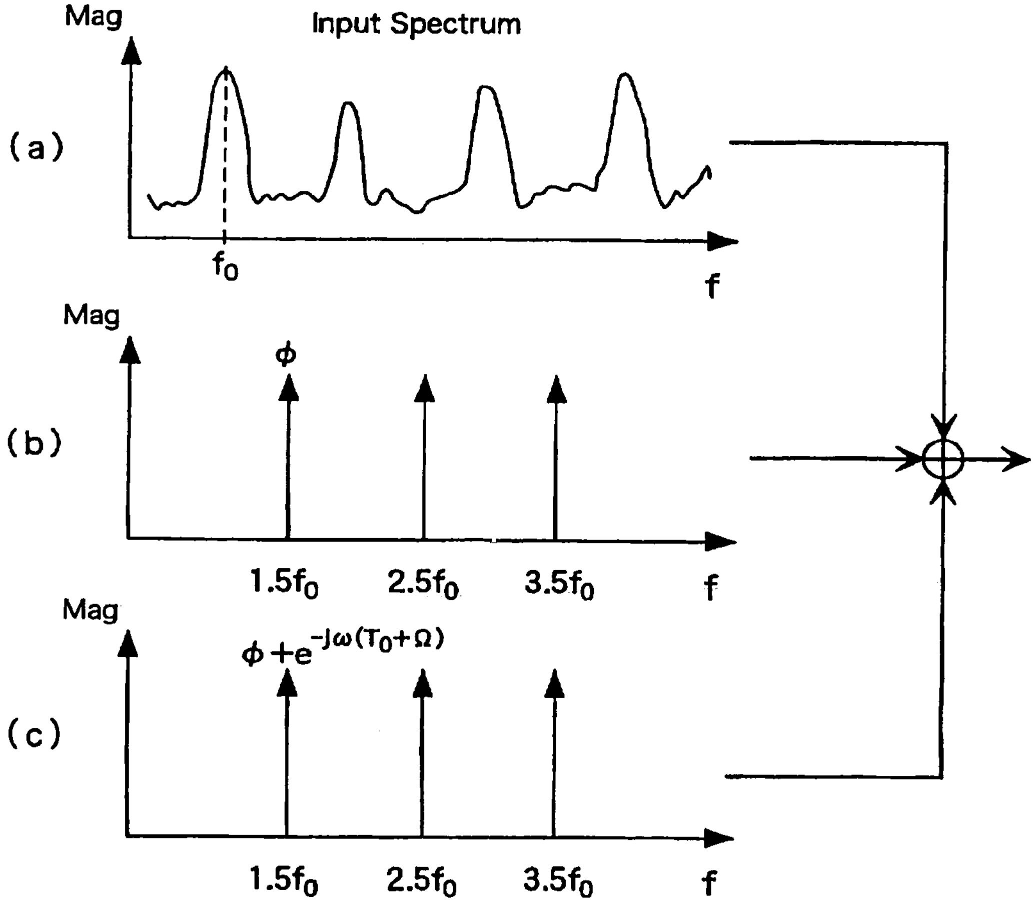
FIG. 3 is a diagram showing a process performed by a first subharmonics provision section.

The first subharmonics provision section 6 reproduces the above-mentioned phenomenon by means of a signal process in the frequency domain. Referring now to FIG. 3, the following describes the process performed in the first subharmonics provision section 6.

FIG. 3(*a*) shows an input spectrum, where $f_0$ denotes a pitch frequency. FIGS. 3(*b*) and 3(*c*) show spectrum components inserted at frequency positions 1.5 $f_0$, 2.5 $f_0$, and so on between harmonic frequencies. In this example, sine-wave spectrum components are provided. The spectrum components may be inserted at 1.4 $f_0$, 2.6 $f_0$, and so on between the input peak frequencies. Each phase $\phi$ in FIG. 3(*b*) is obtained by adding a phase to the peak phase for the input spectrum immediately preceding the frequency for phase $\phi$ so as to shift the frequencies (e.g., shifting $f_0$ to 1.5 $f_0$). A phase in FIG. 3(*c*) results from adding a phase randomly modified from $T_0$ to the phase for the spectrum component at the same frequency position in FIG. 3(*b*). In FIG. 3(*c*), Ω indicates an irregularly varying value at a specified interval.

The spectrum components in (b) and (c) are found at the same frequency positions. However, the phases in (c) are modified irregularly. Consequently, adding the spectrum components in (b) and (c) together irregularly varies the gains at frequency positions 1.5 $f_0$, 2.5 $f_0$, and so on. Further, adding the input spectrums in (a) can yield a spectrum containing subharmonics with irregularly varying gains. The method of generating subharmonics may be based on not only controlling phases as mentioned above, but also directly controlling gains.

In this manner, it is possible to provide input voices with the effect of creak (squeaking) voice quality.

Further, the intensity of this effect can be adjusted by changing gains for the sine-wave spectrum components in (b) and (c).

While there has been described the method of adding two sine-wave spectrum components in (b) and (c), it may be preferable to add three or more sine-wave spectrum components.

Spectrum components to be provided are not limited to sine-wave ones. They may be shaped like a triangular wave or may be extracted from a specified frequency range of previously recorded actual voice waveforms. More diversified effects become available because a user can select spectrum components to be provided according to his or her preference. Further, it may be preferable to specify types of spectrum components to be provided according to frequencies.

In addition, the intensity of effects can be adjusted by specifying how much frequency positions for the spectrum components to be provided should be deviated from the center of harmonic frequencies (deviation amount specification). Alternatively, it may be preferable to randomly vary the deviation amount.

The following describes a subharmonics provision process performed by the second subharmonics provision section 7.

Figure 4:
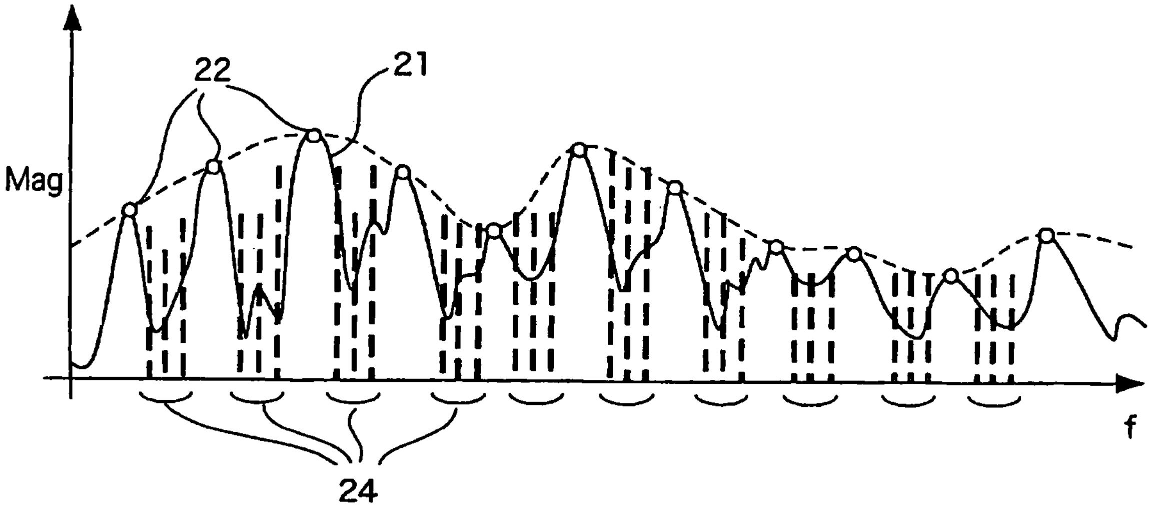
FIG. 4 is a diagram exemplifying a spectrum for analyzing a growl voice.

FIG. 4 shows a spectrum example of analyzing a growl (howl) voice.

Like the case in FIG. 2, a clear voice allows local peak frequencies (white circles 22 in FIG. 4) to approximately correspond to harmonic frequencies. The resulting spectrum (a solid line 21 in FIG. 4) is shaped to have no other local peaks having large gains.

However, it can be understood that the growl voice quality causes a plurality of peaks (indicated by broken lines in FIG. 4) near a frequency position (between harmonic frequencies) denoted by reference numeral 24 in FIG. 4.

The second subharmonics provision section 7 simulates this phenomenon to provide a distortion effect causing the growl voice quality.

This embodiment adds sine wave components for the number of n (an integer greater than or equal to 2) frequencies as subharmonics corresponding to the ith local peak in the input spectrum.

Assuming that k is 0, 1, 2, . . . , or n−1, the following equation is used to find frequency fki for the kth sine wave component to be added.

$$fki=(i+1)\times \text{pitch}_{syn}+(k+1)\times(1/(n+1))\times \text{pitch}, \quad (1)$$

In this equation, $\text{pitch}_{syn}$ represents a synthesized pitch and “pitch” represents the input pitch.

This equation can add new n sine wave components at equal frequency intervals between harmonic frequencies.

Instead of evenly arranging frequencies as formulated in the above-mentioned equation, it may be preferable to add n sine wave components at random frequency intervals.

In this manner, the second subharmonics provision section 7 adds a plurality of spectrum components between the peak frequencies in the input spectrum to convert an input voice into the growl (howl) voice quality.

A user can control the number of subharmonics (n) to be added according to his or her preference to adjust the effect to be provided.

The effect intensity can be adjusted by adjusting gains for sine-wave spectrum components to be added. The effect intensity can be further fine-tuned by individually changing gains for respective sine-wave spectrum components.

Furthermore, the effect intensity can be controlled by controlling the phases of sine-wave spectrum components to be added.

Spectrum components to be provided are not limited to sine-wave ones. They may be shaped like a triangular wave or may be extracted from previously recorded actual voice waveforms. More diversified effects become available because a user can select spectrum components to be provided according to his or her preference.

The above-mentioned embodiment has no consideration for the magnitude (gain) of input voice. However, it may be more effective to vary the effect intensity in accordance with the input voice magnitude. For example, increasing the sound volume generally increases the feeling of growl (howl). On the contrary, decreasing the sound volume generally decreases the feeling of growl (howl).

The following describes another embodiment of the sound effect applying apparatus according to the present invention so as to represent such natural feeling by controlling the above-mentioned parameters in accordance with input voice characteristics such as gains and pitches.

Figure 5:
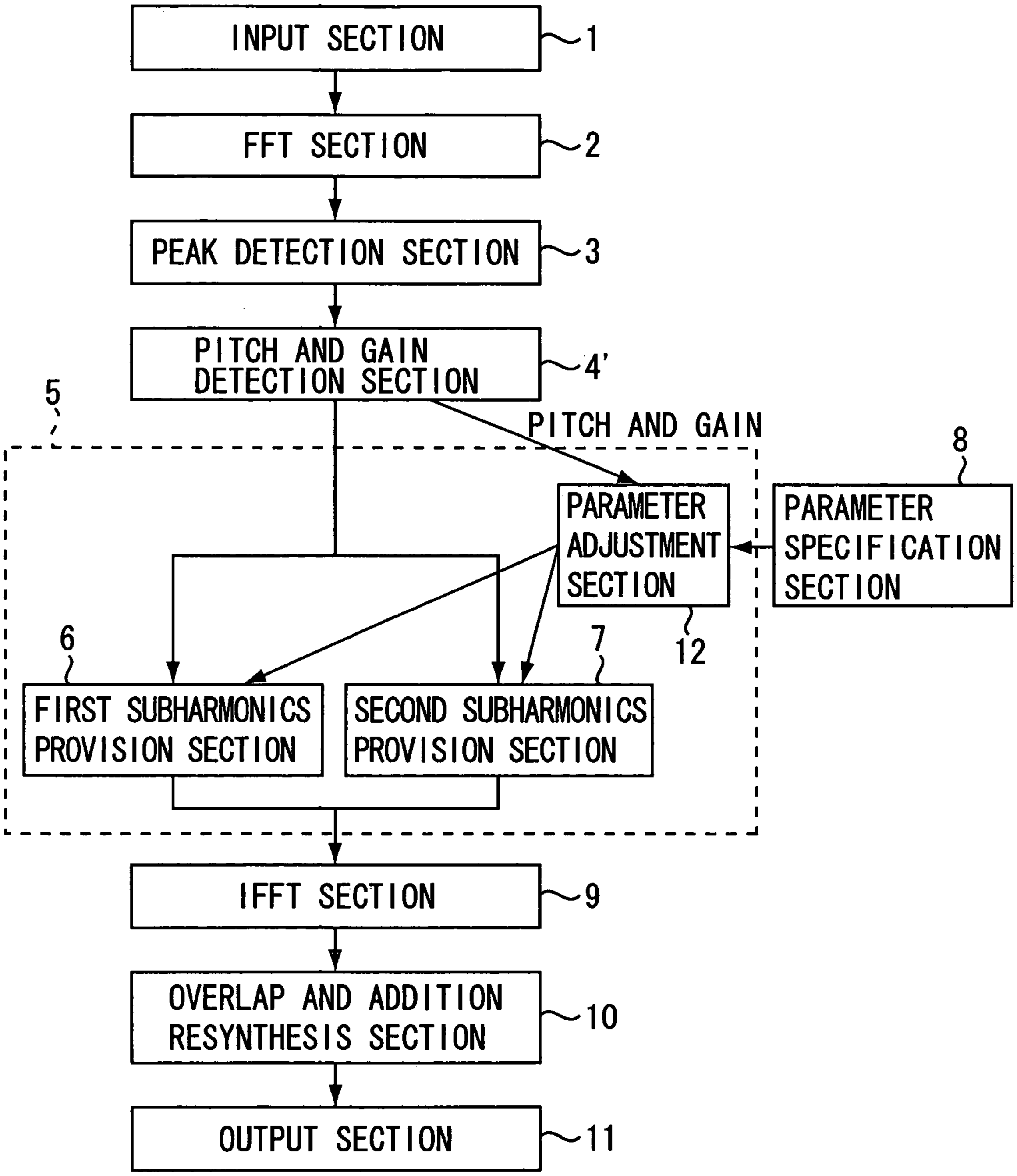
FIG. 5 is a function block diagram showing the configuration of another embodiment of the sound effect applying apparatus according to the present invention.

FIG. 5 is a function block diagram showing the configuration of another embodiment of the sound effect applying apparatus according to the present invention. The mutually corresponding constituent elements in FIGS. 5 and 1 are designated by the same reference numerals and a detailed description is omitted for simplicity. This embodiment can be also implemented by computer’s program processes.

The following differences will be clearly understood in comparison between FIGS. 1 and 5. This embodiment newly provides a parameter adjustment section 12 between the parameter specification section 8 and the two subharmonics provision sections, i.e., the first subharmonics provision section 6 and the second subharmonics provision section 7. The pitch detection section 4 in FIG. 1 is changed to a pitch and gain detection section 4'. The parameter adjustment section 12 is supplied with a pitch and a gain detected by the pitch and gain detection section 4'.

The parameter adjustment section 12 controls parameters supplied from the parameter specification section 8 in accordance with characteristics such as input voice’s pitches and gains and supplies these parameters to the first subharmonics provision section 6 or the second subharmonics provision section 7.

This makes it possible to use parameters corresponding to characteristics such as input voice’s pitches and gains and provide natural effects.

Figure 6:
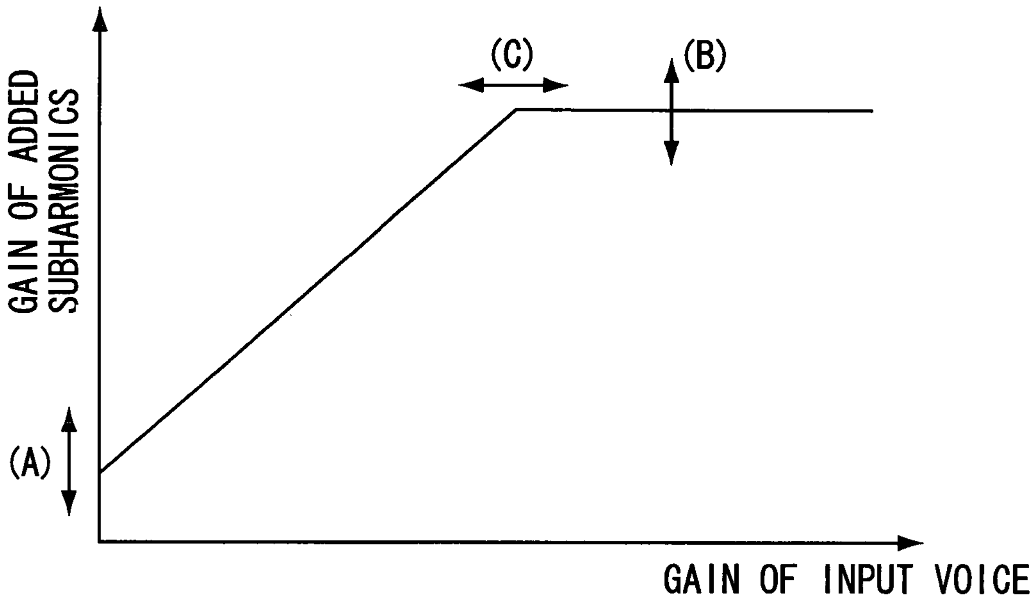
FIG. 6 is a diagram showing a process performed by a parameter adjustment section of the sound effect applying apparatus.

FIG. 6 exemplifies parameter control provided by the parameter adjustment section 12.

This example concerns provision of a growling effect and shows a case of varying gains of subharmonics to be added in accordance with the curve as shown in FIG. 6 corresponding to an input voice gain. As shown in FIG. 6, the gain of subharmonics to be added increases as the input voice gain increases. When the input voice gain exceeds a specified value, the subharmonics gain is saturated. That is, the parameter adjustment section 12 has a coefficient table corresponding to the curve in FIG. 6. The parameter adjustment section 12 reads a coefficient corresponding to the gain of the input voice from the pitch and gain detection section 4'. The parameter adjustment section 12 multiplies the coefficient by a parameter specifying the gain of the subharmonics supplied from the parameter specification section 8 and supplies a result to the second subharmonics provision section 7.

In this manner, the growl effect decreases when the sound volume is small, making it possible to simulate the naturalness.

The effect intensity can be adjusted by controlling (A) a gain for subharmonic at the beginning of applying the effect in FIG. 6, (B) a gain for the maximum subharmonic, and (C) a gain for an input voice reaching the gain for the maximum subharmonic.

There has been described the example of applying the growling effect by means of the second subharmonics provision section 7. When providing the effect, the first subharmonics provision section 6 can similarly simulate the naturalness by controlling parameters.

While the above-mentioned embodiment adjusts subharmonics gains, it may be preferable to adjust the other parameters such as the number of subharmonics, for example.

While there has been described the example of controlling parameters in accordance with input voice gains, it may be preferable to adjust parameters in accordance with input voice pitches.

The present invention can be applied to not only voice signals, but also musical instrument sounds and the like.

What is claimed is:

1. A computer-implemented method for use in a sound effect applying apparatus, the computer-implemented method, when executed by the sound effect applying apparatus, comprising the steps of:

receiving an input signal of sound or voice;

frequency analyzing the input signal to obtain a frequency spectrum of the input signal;

detecting local peaks of a pitch frequency and harmonic frequencies thereof contained in the input signal;

respectively adding a plurality of new spectrum components which are positioned between at least two adjacent pairs of the detected local peaks of the pitch frequency and the harmonic frequencies thereof in the input signal and which are arranged at equal frequency intervals between each adjacent pair of the detected local peaks, the frequency fki, for the kth spectrum component added for the ith detected local peak being determined by the equation:

$$fki=(i+1)\times\text{pitch}_{syn}+(k+1)\times(1/(n+1))\times\text{pitch},$$

where n is an integer number of new spectrum components added between adjacent pairs of the detected local peaks, $n\geqq 2$, k is an integer, $0\leqq k<n-1$, i is an integer, $i\geqq 0$, $\text{pitch}_{syn}$ represents a synthesized pitch at the pitch frequency, and pitch represents an input pitch at the pitch frequency so that a distortion effect is imparted to the input signal to generate a sound-effect imparted signal while preserving relative magnitudes of the detected local peaks of the pitch frequency and the harmonic frequencies thereof; and converting the sound-effect imparted signal to a time domain output signal.

2. The method according to claim 1, wherein new spectrum components are added to the input signal at frequency positions 1.5 times and 2.5 times the pitch frequency.

3. The method according to claim 1, wherein at least one of the new spectrum components is a variable spectrum component having a magnitude which varies irregularly.

4. The method according to claim 3, wherein the variable spectrum component is a mixture of a plurality of spectrum components which have the same frequency but a phase difference which varies irregularly.

5. The method according to claim 3, wherein the magnitude of the variable spectrum component changes in accordance with a magnitude of the input signal.

6. The method according to claim 5, wherein the magnitude of the variable spectrum component increases as the magnitude of the input signal increases and is held when the magnitude of the input signal exceeds a given level.

7. The method according to claim 1, wherein at least one of the new spectrum components has a parameter which varies in accordance with the pitch frequency, the parameter being at least one of a type, a frequency or a magnitude of the at least one new spectrum component.

8. The method according to claim 1, wherein the plurality of new spectrum components have magnitudes which vary in accordance with a magnitude of the input signal.

9. The method according to claim 8, wherein the magnitudes of the plurality of new spectrum components increase as the magnitude of the input signal increases and is held when the magnitude of the input signal exceeds a given level.

10. The method according to claim 1, wherein at least two of the plurality of new spectrum components each has a parameter which varies in accordance with the pitch frequency, the parameter being at least one of a type, a frequency or a magnitude of the new spectrum components.

11. The method according to claim 1, wherein the new spectrum components are sine-wave spectrum components.

12. The method according to claim 1, wherein the new spectrum components are triangular-wave spectrum components.

13. A computer-implemented method for use in a sound effect applying apparatus, the computer-implemented method, when executed by the sound effect applying apparatus, comprising the steps of:

receiving an input signal of sound or voice;

frequency analyzing the input signal to obtain a frequency spectrum of the input signal;

detecting local peaks of a pitch frequency and harmonic frequencies thereof contained in the input signal;

respectively adding, between at least two adjacent pairs of harmonic frequencies of the input signal, a plurality of new spectrum components arranged at equal frequency intervals between each adjacent pair of harmonic frequencies to impart a distortion effect to the input signal, the frequency fki, for the kth spectrum component added for the ith detected local peak being determined by the equation:

$$fki=(i+1)\times\text{pitch}_{syn}+(k+1)\times(1/(n+1))\times\text{pitch},$$

where n is an integer number of new spectrum components added between adjacent pairs of the detected local peaks, $n\geqq 2$, k is an integer, $0\leqq k<n-1$, i is an integer, $i\geqq 0$, $\text{pitch}_{syn}$ represents a synthesized pitch at the pitch frequency, and pitch represents an input pitch at the pitch frequency; and converting the input signal to which the distortion effect is imparted to a time domain output signal.

* * * * *